United States Patent
Kim et al.

(10) Patent No.: US 10,926,564 B2
(45) Date of Patent: Feb. 23, 2021

(54) METHOD OF MANUFACTURING IMPRINT STAMP AND DISPLAY APPARATUS MANUFACTURED USING THE IMPRINT STAMP

(71) Applicant: Samsung Display Co., Ltd., Yongin-si (KR)

(72) Inventors: Min-Uk Kim, Daejeon (KR); Moonjung An, Hwaseong-si (KR); Dongeon Lee, Seoul (KR); Kang Soo Han, Seoul (KR); Gugrae Jo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 493 days.

(21) Appl. No.: 15/628,083

(22) Filed: Jun. 20, 2017

(65) Prior Publication Data
US 2018/0022133 A1 Jan. 25, 2018

(30) Foreign Application Priority Data
Jul. 19, 2016 (KR) .................. 10-2016-0091137

(51) Int. Cl.
| G03F 7/00 | (2006.01) |
| B82Y 40/00 | (2011.01) |
| B41K 1/50 | (2006.01) |
| G02B 5/30 | (2006.01) |
| B41K 1/04 | (2006.01) |
| B82Y 10/00 | (2011.01) |

(52) U.S. Cl.
CPC .................. *B41K 1/50* (2013.01); *B41K 1/04* (2013.01); *B82Y 10/00* (2013.01); *G02B 5/3058* (2013.01); *G03F 7/0002* (2013.01); *B82Y 40/00* (2013.01)

(58) Field of Classification Search
None
See application file for complete search history.

(56) References Cited

U.S. PATENT DOCUMENTS

| 6,243,199 B1 | 6/2001 | Hansen et al. |
| 6,288,840 B1 | 9/2001 | Perkins et al. |
| 7,965,357 B2 | 6/2011 | Van De Witte et al. |
| 9,080,748 B2 | 7/2015 | Sohn et al. |
| 2002/0115002 A1 | 8/2002 | Bailey et al. |
| 2014/0055715 A1 | 2/2014 | Lee et al. |
| 2016/0114502 A1 | 4/2016 | Han et al. |

FOREIGN PATENT DOCUMENTS

| KR | 10-1031528 | 4/2011 |
| KR | 10-2014-0030382 | 3/2014 |
| KR | 10-2016-0049162 | 5/2016 |

*Primary Examiner* — Joshua D Zimmerman
(74) *Attorney, Agent, or Firm* — H.C. Park & Associates, PLC

(57) ABSTRACT

A method of manufacturing an imprint stamp including forming an imprint resist only in a second area of a sample substrate including a first area and the second area, pressing the imprint resist with the imprint stamp and curing the imprint resist, in which the imprint stamp includes a fine protrusion pattern that corresponds to the first area and the second area of the sample substrate, and separating the imprint stamp from the sample substrate such that a portion of the fine protrusion pattern corresponding to the second area is separated from the imprint stamp by the cured imprint resist.

13 Claims, 17 Drawing Sheets

EXTENDING
DIRECTIONS OF
WGP AND TRACK

METHOD OF MANUFACTURING IMPRINT STAMP AND DISPLAY APPARATUS MANUFACTURED USING THE IMPRINT STAMP

CROSS-REFERENCE TO RELATED APPLICATION

This application claims priority from and the benefit of Korean Patent Application No. 10-2016-0091137, filed on Jul. 19, 2016, which is hereby incorporated by reference for all purposes as if fully set forth herein.

BACKGROUND

Field

Exemplary embodiments relate to a method of manufacturing an imprint stamp, and a display apparatus manufactured by the imprint stamp. More particularly, exemplary embodiments relate to a method of manufacturing an imprint stamp for forming a wire grid polarizer, and a display apparatus manufactured by the imprint stamp.

Discussion of the Background

Recently, a display apparatus having light weight and small size has been manufactured. A cathode ray tube (CRT) display apparatus has been used in the pas due to its performance and competitive price. However, the CRT display apparatus generally has the disadvantages of large size and lack of portability. Therefore a display apparatus, such as a plasma display apparatus, a liquid crystal display apparatus, and an organic light emitting display apparatus has been highly regarded due to its small size, light weight, and low-power-consumption.

A display apparatus may include a polarizing plate for polarizing a transmitted light. A polyvinyl alcohol (PVA) polarizing plate is generally used as the polarizing plate. Recently, a wire grid polarizer (WGP) has been used. In this case, the wire grid polarizer and a light blocking pattern (black matrix) of the display apparatus may be formed on the same plane, and may be formed by a imprint lithography method using an imprint stamp.

However, manufacturing an imprint stamp capable of forming the light blocking pattern and the wire grid polarizing element at once has proven to be difficult, since the light blocking pattern may have a general pattern that is relatively larger than a fine pattern of the wire grid polarizing element.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an imprint stamp capable of forming a fine pattern and a normal pattern at once.

Exemplary embodiments also provide a display apparatus manufactured by the imprint stamp.

Additional aspects will be set forth in the detailed description which follows, and, in part, will be apparent from the disclosure, or may be learned by practice of the inventive concept.

According to an exemplary embodiment, a method of manufacturing an imprint stamp includes forming an imprint resist only in a second area of a sample substrate including a first area and the second area, pressing the imprint resist with the imprint stamp and curing the imprint resist, in which the imprint stamp includes a fine protrusion pattern that corresponds to the first area and the second area of the sample substrate, and separating the imprint stamp from the sample substrate, such that a portion of the fine protrusion pattern corresponding to the second area is separated from the imprint stamp by the cured imprint resist.

The fine protrusion pattern may have the same pattern as a wire grid pattern.

A pitch of the fine protrusion pattern may be 50 nm to 150 nm.

The sample substrate may include a sample pattern in the second area.

The sample substrate may include a display substrate of a display apparatus, and the sample pattern may include a black matrix pattern of the display apparatus.

A line width of the sample pattern may be at least 10 μm.

The imprint resist may include at least one of thermosetting resin and photocurable resin.

The fine protrusion pattern of the imprint stamp may be formed by curing the at least one of the thermosetting resin and photocurable resin.

The imprint resist and the fine protrusion pattern may include the same material.

In the step of separating the imprint stamp from the sample substrate, a process condition may be set such that a bonding force between the cured imprint resist and the fine protrusion pattern is greater than a releasing force between the cured imprint resist and the fine protrusion pattern, and greater than strength of a structure of the fine protrusion pattern.

The imprint resist may be formed only in the second area using an inkjet method.

The imprint resist may contact the sample substrate.

A sample pattern may be formed in the second area of the sample substrate, and the imprint resist may be disposed on the sample pattern.

According to an exemplary embodiment, a method of manufacturing an imprint stamp includes forming an imprint resist in a second area of a sample substrate including a first area and the second area, pressing the imprint resist with the imprint stamp and curing the imprint resist, the imprint stamp including a fine protrusion pattern corresponding to the first area and the second area of the sample substrate, and separating the imprint stamp from the sample substrate such that the cured imprint resist in the second area is attached to the fine protrusion pattern and separated from the sample substrate.

The sample substrate may further include a reversal pattern disposed in the first area, and an imprint resist layer covering the reversal pattern and disposed in the first area and in the second area of the sample substrate.

The fine protrusion pattern may have the same pattern as a wire grid polarizer, a pitch of the fine protrusion pattern may be 50 nm to 150 nm, and a width of the second area may be at least 10 μm.

The imprint resist may be directly formed only in the second area of the sample substrate using an inkjet method.

According to an exemplary embodiment, a display apparatus includes a substrate, and a first layer disposed on the substrate and including a first area and a second area, a wire grid polarizer pattern and a black matrix pattern for blocking light disposed in the first area and the second area, respectively, and a plurality of tracks disposed on a surface of the black matrix pattern in a direction parallel to an extending direction of a fine line of the wire grid polarizer pattern, in which a distance between the tracks is equal to, or is integral multiples of, a pitch of the wire grid polarizer pattern.

The track may be a groove formed in the direction parallel to the extending direction of the fine line of the wire grid polarizer pattern.

A width of the black matrix pattern may be at least 10 μm, and the pitch of the fine protrusion pattern is 50 nm to 150 nm.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
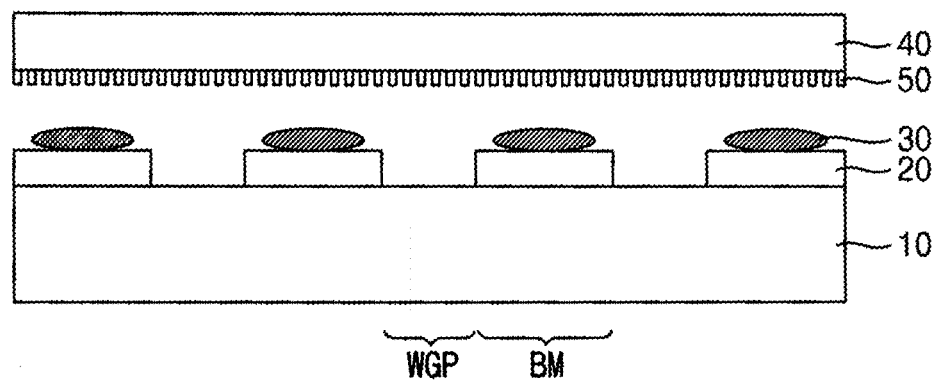
FIG. 1A, FIG. 1B, FIG. 1C, FIG. 1D, FIG. 1E, FIG. 1F, and FIG. 1G are cross-sectional views illustrating a method of manufacturing an imprint stamp and a method of manufacturing a fine pattern and a normal pattern at once using the imprint stamp according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1A to 1G are cross-sectional views illustrating a method of manufacturing an imprint stamp and a method of manufacturing a fine pattern and a normal pattern at once using the imprint stamp according to an exemplary embodiment.

Referring to FIG. 1A, an imprint stamp according to an exemplary embodiment includes a stamp substrate 40 and a fine protrusion pattern 50 formed on the stamp substrate 40. The fine protrusion pattern 50 may have a pattern width of several tens to several hundreds of nanometers.

The imprint stamp may be a large area stamp (or template) for forming a wire grid polarizing element. For example, the fine protrusion pattern 50 may include a plurality of fine protrusions formed at regular intervals and having the same shape. The fine protrusions may have a pitch of about 50 nm (nanometer) to about 150 nm. As used herein, the pitch may refer to sum of a width of one fine protrusion and a distance between adjacent fine protrusions.

A sample may include a sample substrate 10 and a sample pattern 20 formed on the sample substrate 10. The sample may be a display substrate including a black matrix pattern. For example, the sample substrate 10 may be a display substrate of a display apparatus, and the sample pattern 20 may be a black matrix pattern, which may be a light blocking pattern. The sample may be a substrate on which the black matrix pattern is formed on, or may be a display substrate used in a manufacturing process of an actual display apparatus.

The sample pattern 20 may be protruded from the sample substrate 10. Accordingly, the sample substrate 10 may include a first area WGP in which the sample pattern 20 is not formed, and a second area BM in which the sample pattern 20 is formed. A wire grid polarizer of the display apparatus may be formed to correspond to the first area WGP. A black matrix pattern of the display apparatus may be formed to correspond to the second area BM.

The sample pattern 20 may correspond to the black matrix of the display apparatus. As such, the sample pattern 20 may have a line width of several tens to several hundreds of micrometers (um) or more.

An imprint resist 30 may be disposed on the sample pattern 20 in the second area BM. The imprint resist 30 may include thermosetting resin or photocurable resin that is well known in the art. For example, the thermosetting resin may include urea resin, melamine resin, phenol resin, and etc. In addition, the photocurable resin may include a polymerizable compound having a polymerizable functional group, a photopolymerization initiator that initiates polymerization reaction of the polymerizable compound upon irradiation of light, a surfactant, an antioxidant, and the like, but is not limited thereto. The imprint resist 30 may be disposed on the sample pattern 20 in the second area BM by an inkjet method, and the like.

Figure 1B:
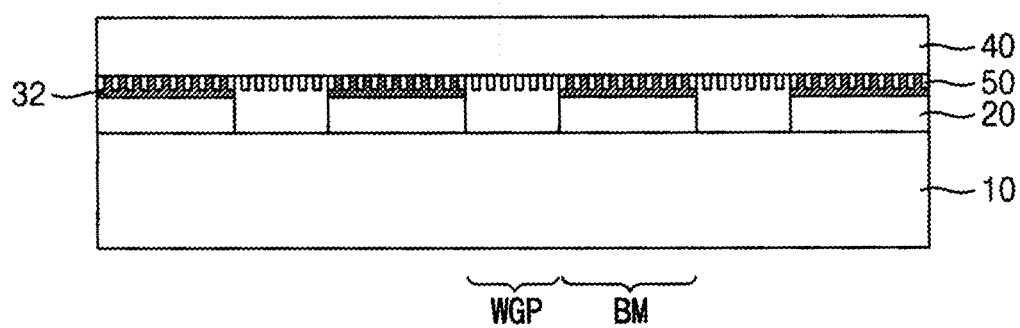

Referring to FIG. 1B, the imprint resist 30 may be pressed by the imprint stamp to form an imprint resist pattern 32. Then, the imprint resist pattern 32 may be hardened. For example, when the imprint resist pattern 32 includes the thermosetting resin, the imprint resist pattern 32 may be cured by heat. Alternatively, when the imprint resist pattern 32 includes a photocurable resin, the imprint resist pattern 32 may be cured by irradiating ultraviolet light.

Figure 1C:
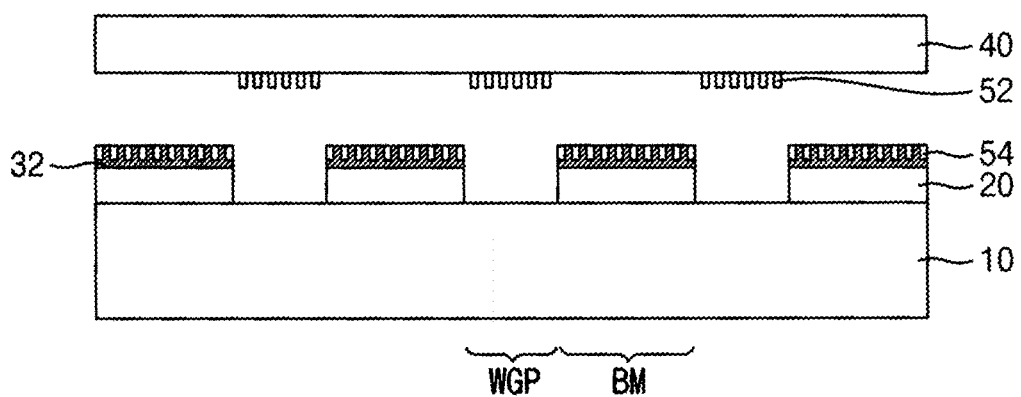

Referring to FIG. 1C, the imprint stamp may be separated from the sample. In particular, a portion of the fine protrusion pattern 50 that overlaps the second area BM may be removed from the stamp substrate 40, thereby forming a fine pattern 52 on the stamp substrate 40. Accordingly, the fine pattern 52 may be formed only in the specific region of the stamp substrate 40.

More particularly, a portion of the fine protrusion pattern 50 that overlaps the second area BM may be separated from the stamp substrate 40 by the imprint resist pattern 32. As such, the sample pattern 20 may be formed with a remaining fine protrusion pattern 54. Thus, the fine pattern 52 may not be formed in certain regions of the stamp substrate 40.

For example, when the imprint stamp is separated from the sample, process conditions may be controlled such that a bonding force between the hardened imprint resist pattern 32 and the fine protrusion pattern 50 is greater than a releasing force therebetween, and greater than the strength of the structure of the fine protrusion pattern 50. In this manner, by separating the imprint stamp from the sample, the fine protrusion pattern 50 in the second area BM may be separated from the stamp substrate 40. Accordingly, the imprint stamp having the fine pattern 52 formed only in the first area WGP, and not formed in the second area BM, may be manufactured.

Here, materials of the fine protrusion pattern 50 and the imprint resist pattern 32 may be suitably selected for above process conditions. For example, the fine protrusion pattern 50 and the imprint resist 30 may include the same resin. In addition, curing conditions of the fine protrusion pattern 50 and the imprint resist 30 may be appropriately selected to satisfy the above process conditions.

Figure 1D:
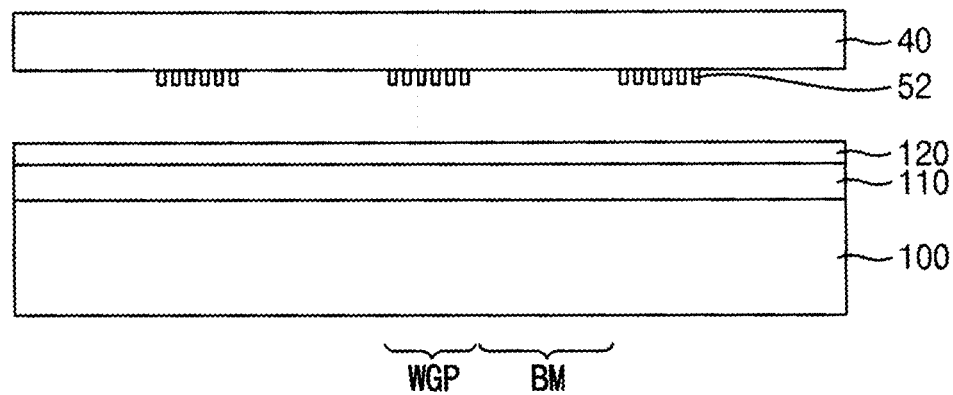

Referring to FIG. 1D, the imprint stamp having the fine pattern 52, which is formed only in the first area WGP of the stamp substrate 40, may be provided.

A first layer 110 may be formed on a substrate 100. An imprint resist layer 120 may be formed on the first layer 110. The substrate 100 may be a display substrate of a display apparatus, and the first layer 110 may be one layer of the display substrate, which may include a wire grid polarizer pattern and a black matrix.

The first layer 110 may include metal. For example, the first layer 110 may include aluminum (Al), titanium (Ti), copper (Cu), indium tin oxide (ITO), indium zinc oxide (IZO), and the like. These may be used alone or in combination with each other. In an exemplary embodiment, the first layer 110 may include an inorganic material, such as silicon nitride ($SiN_x$), silicon oxide ($SiO_x$), and the like. The imprint resist layer 120 may include thermosetting resin or photocurable resin that is well known in the art.

Figure 1E:
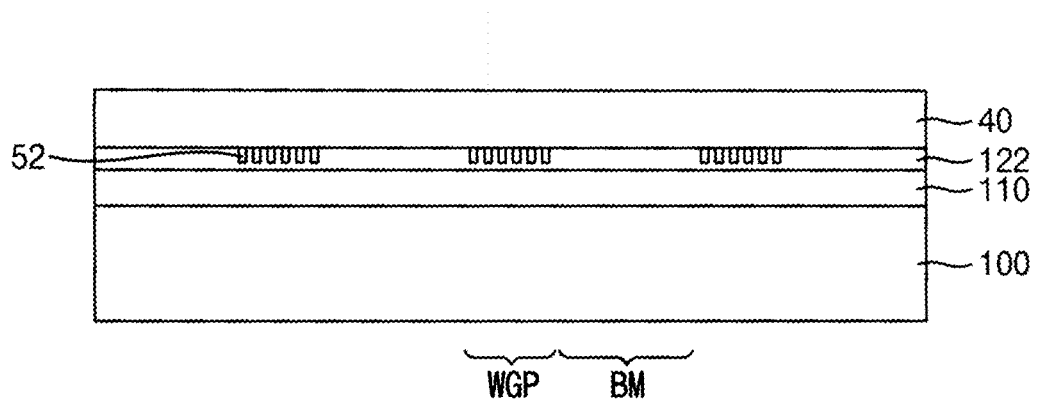

Referring to FIG. 1E, the imprint resist layer 120 may be pressed by the imprint stamp to form an imprint resist pattern 122. And then, the imprint resist pattern 122 may be hardened. For example, the imprint resist pattern 122 may be cured by heat or irradiating ultraviolet light.

Figure 1F:
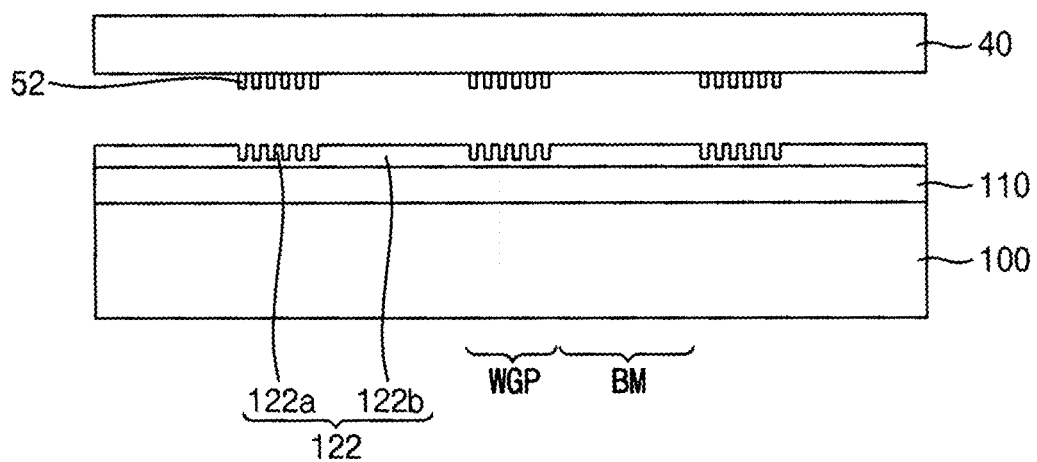

Referring to FIG. 1F, the imprint stamp may be separated from the imprint resist pattern 122. Accordingly, the imprint resist pattern 122 includes a fine pattern 122a formed in the first area WGP and a normal pattern 122b formed in the second area BM. Then, although not illustrated, a residual layer of the fine pattern 122a may be removed.

Figure 1G:
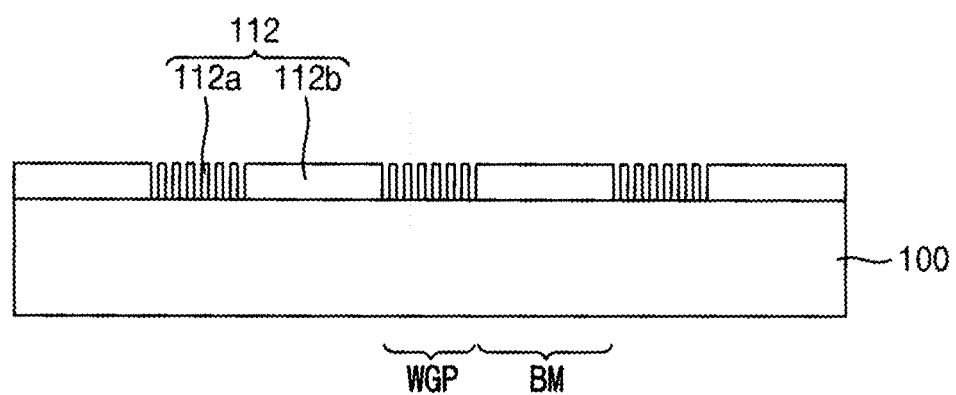

Referring to FIG. 1G, the first layer 110 may be etched using the imprint resist pattern 122 as a mask, so that a first layer pattern 112 may be formed. The first layer pattern 112 may include a fine pattern 112a formed in the first area WGP and a normal pattern 112b formed in the second area BM.

The substrate 100 may be a display panel of a display apparatus. Here, the display apparatus may include the display substrate 100 and the first layer pattern 112 formed on the display substrate 100. The first layer pattern 112 may include the fine pattern 112a and the normal pattern 112b. For example, the fine pattern 112a may be a wire grid polarizer pattern and the normal pattern 112b may be a black matrix pattern. Here, the wire grid polarizer pattern may have a line width of several tens to several hundreds of nanometers, and the black matrix pattern may have a line width of several tens to several hundreds of micrometers or more.

According to an exemplary embodiment described above, an imprint stamp including a fine pattern and a normal pattern may be manufactured by a relatively simple method without an additional photolithography process.

In addition, an imprint stamp according to an exemplary embodiment may simultaneously form a wire grid pattern and a black matrix pattern, without any additional design cost, by using the black matrix pattern of a display substrate as the sample.

FIGS. 2A to 2G are cross-sectional views illustrating a method of manufacturing an imprint stamp and a method of manufacturing a fine pattern and a normal pattern at once using the imprint stamp according to an exemplary embodiment. The method described below may be substantially similar to those illustrated above in FIGS. 1A-1G, except that an imprint resist is directly formed in a second area on a sample substrate, instead of the sample pattern. Thus, repeated descriptions of substantially similar steps and elements will be omitted.

Figure 2A:
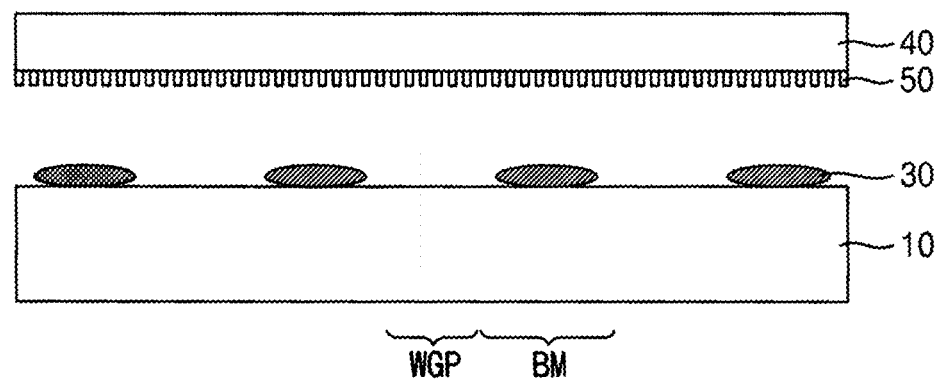
FIG. 2A, FIG. 2B, FIG. 2C, FIG. 2D, FIG. 2E, FIG. 2F, and FIG. 2G are cross-sectional views illustrating a method of manufacturing an imprint stamp and a method of manufacturing a fine pattern and a normal pattern at once using the imprint stamp according to an exemplary embodiment.

Referring to FIG. 2A, an imprint stamp may include a stamp substrate 40 and a fine protrusion pattern 50 formed on the stamp substrate 40.

A sample may include a sample substrate 10. The sample substrate 10 may include a first area WGP and a second area BM. An imprint resist 30 may be disposed in the second area BM of the sample substrate 10. The imprint resist 30 may be formed only in the second area BM of the sample substrate 10 by an inkjet method, and the like.

Figure 2B:
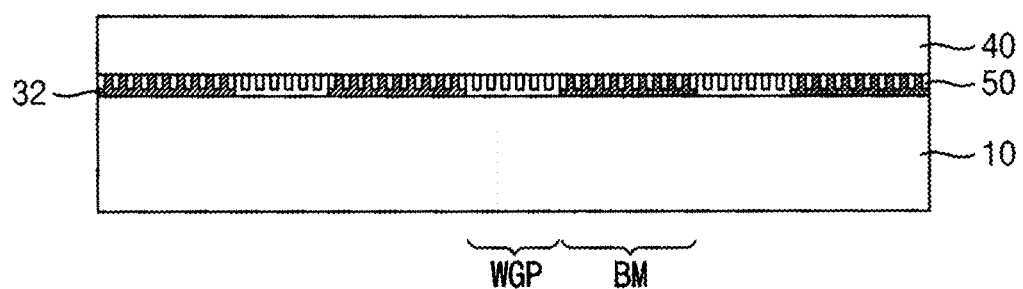

Referring to FIG. 2B, the imprint resist 30 may be pressed by the imprint stamp to form an imprint resist pattern 32. Then, the imprint resist pattern 32 may be hardened.

Figure 2C:
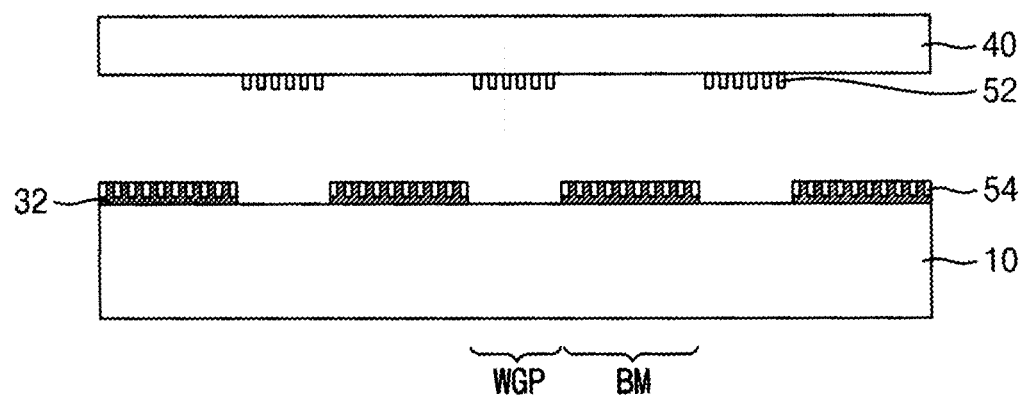

Referring to FIG. 2C, an imprint stamp having a fine pattern 52 in a specific region may be formed by separating the imprint stamp from the sample. The imprint stamp may include the fine pattern 52 formed only in the first area WGP. In the second area BM, the fine protrusion pattern 50 may be separated from the stamp substrate 40 by the imprint resist pattern 32, thereby forming a remaining fine protrusion pattern 54 on the sample substrate 10. In this manner, the fine pattern 52 may not be formed in other regions of the stamp substrate 40, because a portion of the fine protrusion pattern 50 is separated from the stamp substrate 40 by the imprint resist pattern 32.

Figure 2D:
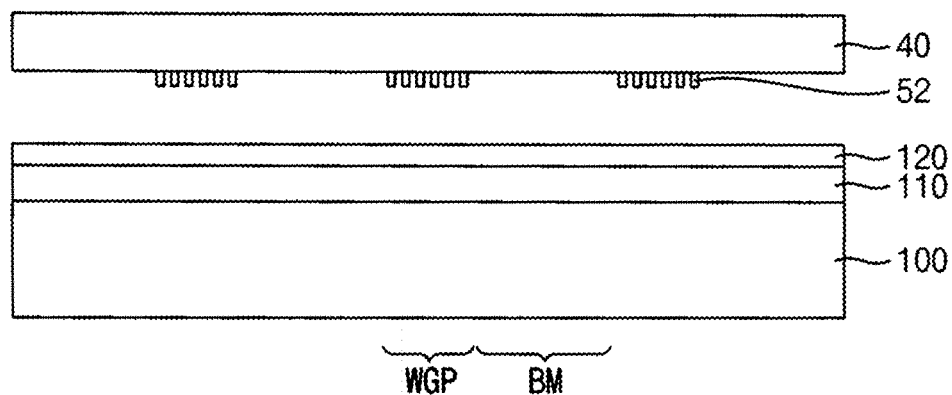

Referring to FIG. 2D, the imprint stamp may have the fine pattern 52 formed only in the first area WGP of the stamp substrate 40.

A first layer 110 may be formed on a substrate 100. An imprint resist layer 120 may be formed on the first layer 110.

Figure 2E:
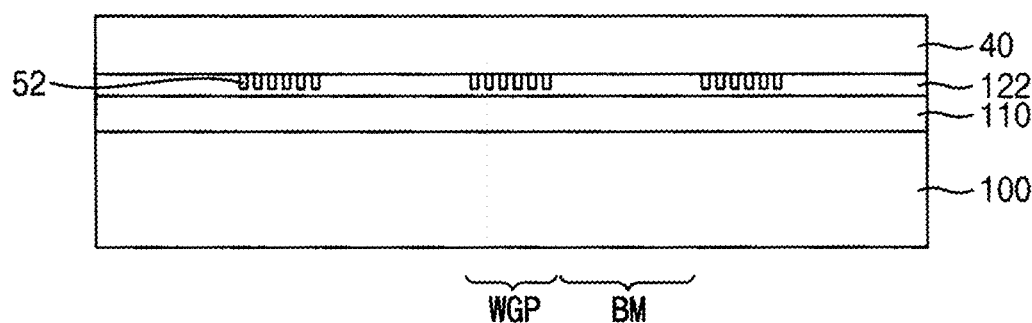

Referring to FIG. 2E, the imprint resist layer 120 may be pressed by the imprint stamp to form an imprint resist pattern 122. And then, the imprint resist pattern 122 may be hardened.

Figure 2F:
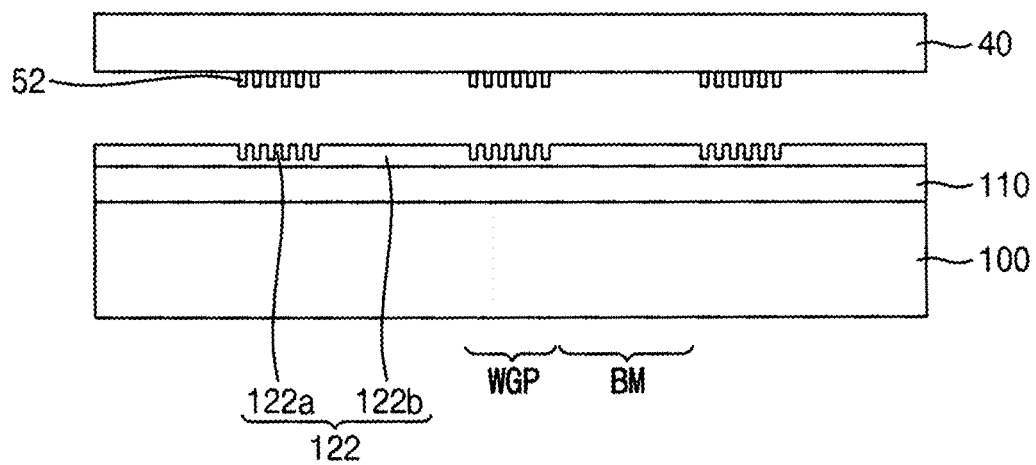

Referring to FIG. 2F, the imprint stamp may be separated from the imprint resist pattern 122. Then, although not illustrated, a residual layer of a fine pattern 122a may be removed.

Figure 2G:
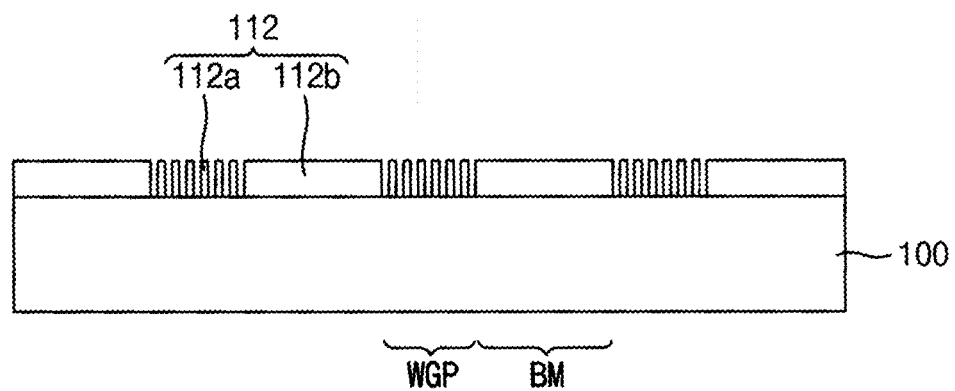

Referring to FIG. 2G, the first layer 110 may be etched using the imprint resist pattern 122 as a mask, so that a first layer pattern 112 may be formed. The first layer pattern 112 may include a fine pattern 112a in the first area WGP and a normal pattern 112b in the second area BM.

FIGS. 3A to 3G are cross-sectional views illustrating a method of manufacturing an imprint stamp and a method of manufacturing a fine pattern and a normal pattern at once using the imprint stamp according to an exemplary embodiment. The method described below may be substantially similar as those illustrated above in FIGS. 1A-1G, except that a reversal pattern is formed, instead of the sample pattern, and except that an imprint resist pattern is attached to a fine protrusion pattern, instead of the fine protrusion pattern of the imprint stamp being separated therefrom. Thus, repeated descriptions of the substantially similar steps and elements will be omitted or briefly mentioned.

Figure 3A:
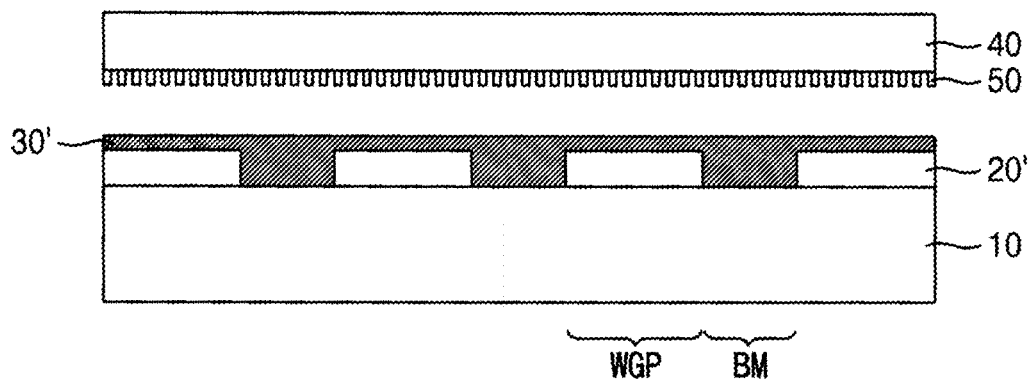
FIG. 3A, FIG. 3B, FIG. 3C, FIG. 3D, FIG. 3E, FIG. 3F, and FIG. 3G are cross-sectional views illustrating a method of manufacturing an imprint stamp and a method of manufacturing a fine pattern and a normal pattern at once using the imprint stamp according to an exemplary embodiment.

Referring to FIG. 3A, an imprint stamp may include a stamp substrate 40 and a fine protrusion pattern 50 formed on the stamp substrate 40.

A sample may include a sample substrate 10 and a reversal pattern 20' formed on the sample substrate 10. The reversal pattern 20' may be formed in a first area WGP of the sample substrate 10. The reversal pattern 20' may be a reversal pattern of a black matrix pattern, which may be a light blocking pattern. Thus, the shape corresponding to the black matrix pattern may be the same as the shape of the second area BM, on which the reversal pattern 20' is not formed.

The reversal pattern 20' may be protruded from the sample substrate 10. Accordingly, the sample substrate 10 may include the first area WGP in which the reversal pattern 20' is formed, and the second area BM in which the reversal pattern 20' is not formed. A wire grid polarizer of the display apparatus may be formed to correspond to the first area WGP. A black matrix pattern of the display apparatus may be formed to correspond to the second area BM.

An imprint resist 30' may be disposed on the reversal pattern 20' and the sample substrate 10. The imprint resist 30' may include thermosetting resin or photocurable resin that is well known in the art.

Figure 3B:
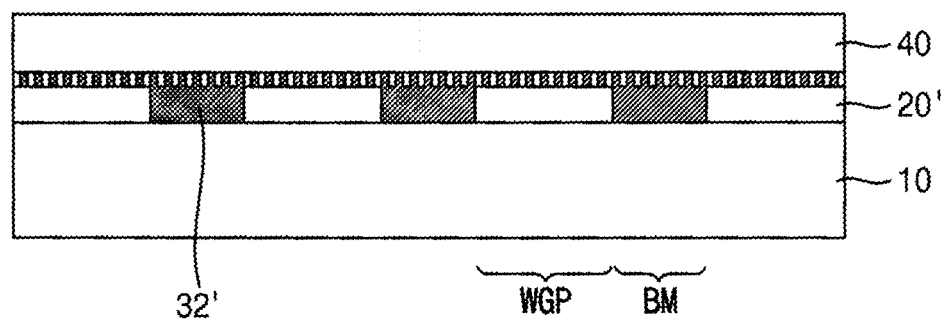

Referring to FIG. 3B, the imprint resist 30' may be pressed by the imprint stamp to form an imprint resist pattern 32'. Then, the imprint resist pattern 32' may be hardened. For example, the imprint resist pattern 32' may be cured by heat or irradiating ultraviolet light.

Here, a process condition may be controlled, such that a portion of the imprint resist pattern layer 32' in the first area WGP is entirely cured and a portion of the imprint resist pattern layer 32' in the second area BM is semi-cured. For example, since a thickness of the imprint resist pattern layer 32' in the second area BM is greater than a thickness of the imprint resist pattern layer 32' in the first area WGP, the curing time of the imprint resist pattern layer 32' may be controlled, so that the portion of the imprint resist pattern layer 32' in the first region WGP is fully cured and the portion of the imprint resist pattern layer 32' in the second area BM is semi-cured.

Figure 3C:
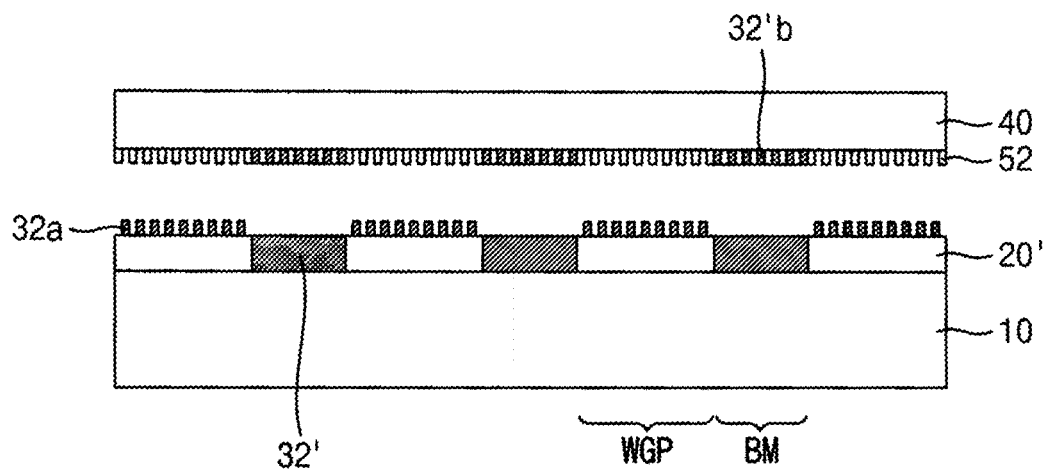

Referring to FIG. 3C, by separating the imprint stamp from the sample, an imprint stamp may have a fine pattern 52 formed in the first area WGP and a normal pattern formed in the second area BM by a second imprint resist pattern 32'b.

When the imprint stamp is separated from the sample, since a portion of the imprint resist pattern layer 32' disposed in the second area BM is semi-cured, the semi-cured portion of the second imprint resist pattern 32'b may be separated from the cured portion of the imprint resist pattern layer 32'. Accordingly, the second imprint resist pattern 32'b is attached between the fine protrusion patterns 50 in the second area BM, so that the fine pattern 52 may not be protruded in the second area BM. On the other hand, the first imprint resist pattern 32a formed in the first area WGP may remain on the reversal pattern 20'. Accordingly, the imprint stamp may have the fine pattern 52 formed only in the first area WGP.

Figure 3D:
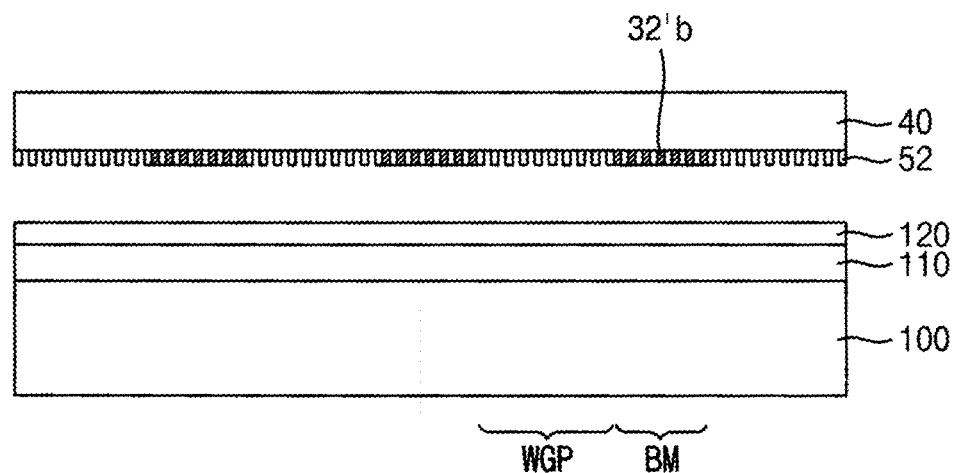

Referring to FIG. 3D, the imprint stamp having the fine pattern 52 formed only in the first area WGP of the stamp substrate 40 may be provided. A first layer 110 may be formed on a substrate 100. An imprint resist layer 120 may be formed on the first layer 110.

Figure 3E:
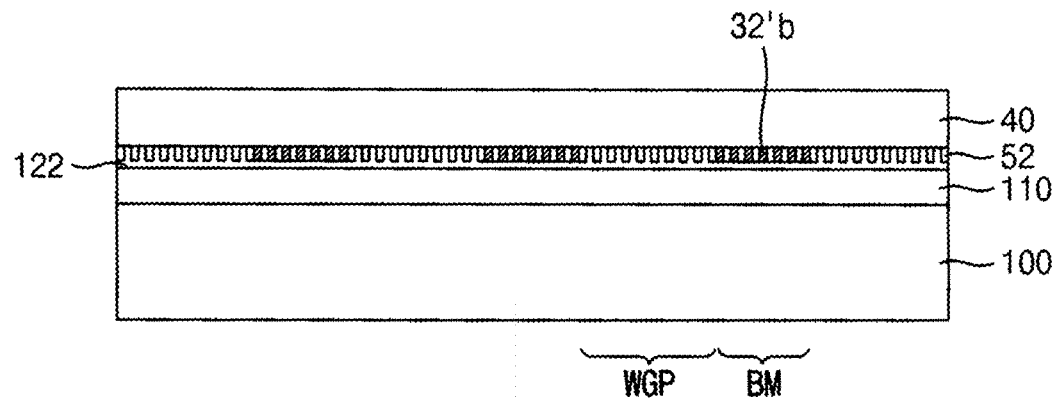

Referring to FIG. 3E, the imprint resist layer 120 may be pressed by the imprint stamp to form an imprint resist pattern 122. Then, the imprint resist pattern 122 may be hardened. For example, when the imprint resist pattern 122 may be cured by heat or irradiating ultraviolet light.

Figure 3F:
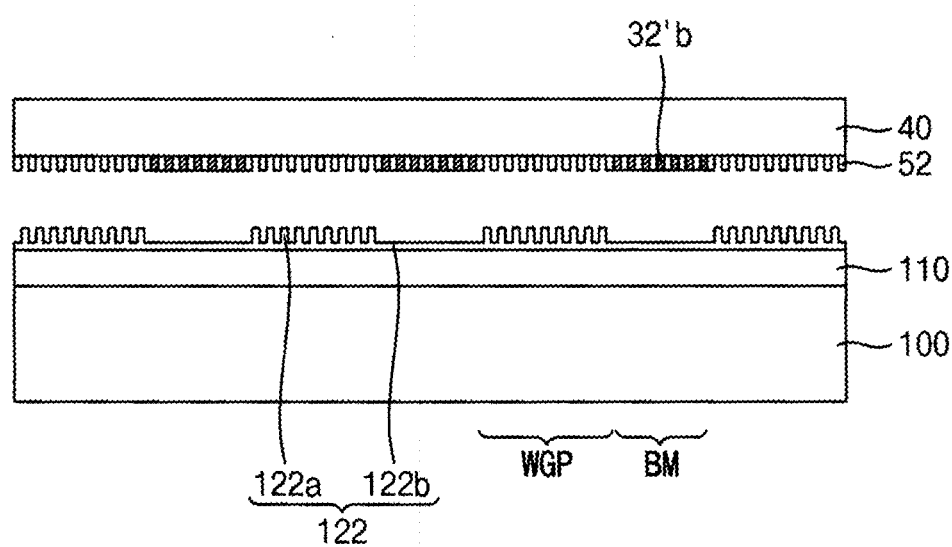

Referring to FIG. 3F, the imprint stamp may be separated from the imprint resist pattern 122. Accordingly, the imprint resist pattern 122 may include a fine pattern 122a formed in the first area WGP and a normal pattern 122b formed in the second area BM. Then, although not illustrated, a residual layer of the fine pattern 122a may be removed.

Figure 3G:
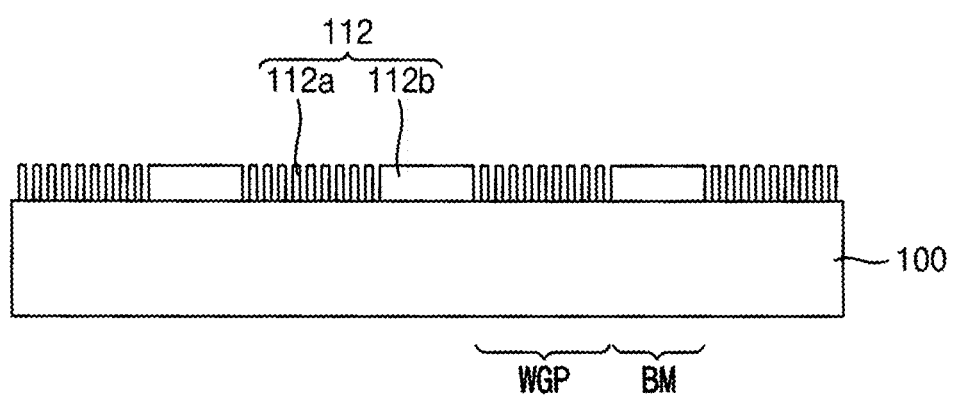

Referring to FIG. 3G, the first layer 110 may be etched using the imprint resist pattern 122 as a mask, so that a first layer pattern 112 may be formed. The first layer pattern 112 may include a fine pattern 112a in the first area WGP and a normal pattern 112b in the second area BM.

FIGS. 4A to 4G are cross-sectional views illustrating a method of manufacturing an imprint stamp and a method of manufacturing a fine pattern and a normal pattern at once using the imprint stamp according to an exemplary embodiment. The method described below may be substantially similar as those illustrated in FIGS. 3A-3G, except that an imprint resist is directly disposed in a second area of a sample substrate, instead of the reversal pattern and the imprint resist layer. Thus, repeated descriptions of the substantially similar steps or elements will be omitted.

Figure 4A:
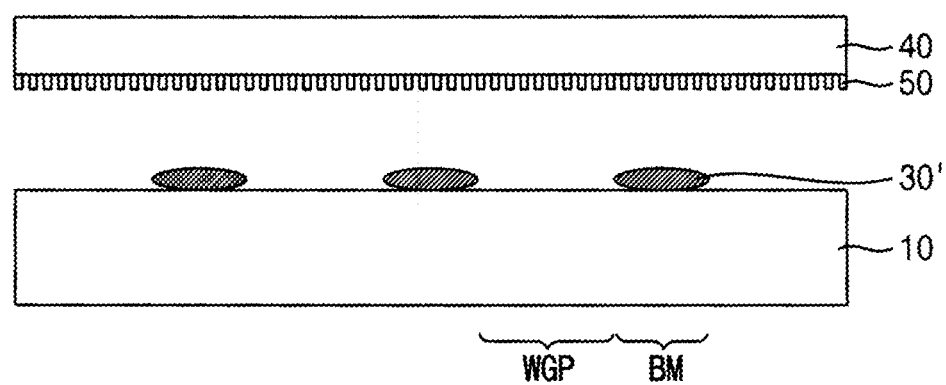
FIG. 4A, FIG. 4B, FIG. 4C, FIG. 4D, FIG. 4E, FIG. 4F, and FIG. 4G are cross-sectional views illustrating a method of manufacturing an imprint stamp and a method of manufacturing a fine pattern and a normal pattern at once using the imprint stamp according to an exemplary embodiment.

Referring to FIG. 4A, an imprint stamp may include a stamp substrate 40 and a fine protrusion pattern 50 formed on the stamp substrate 40.

A sample including a sample substrate 10 may be provided. The sample substrate 10 may include a first area WGP and a second area BM. An imprint resist 30' may be disposed in the second area BM of the sample substrate 10. The imprint resist 30' may be disposed only in the second area BM of the sample substrate 10 by an inkjet method, and the like.

Figure 4B:
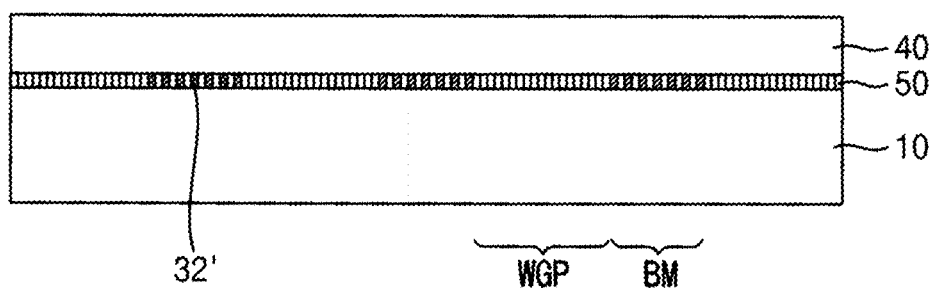

Referring to FIG. 4B, the imprint resist 30' may be pressed by the imprint stamp to form an imprint resist pattern 32'. Then, the imprint resist pattern 32' may be semi-cured.

Figure 4C:
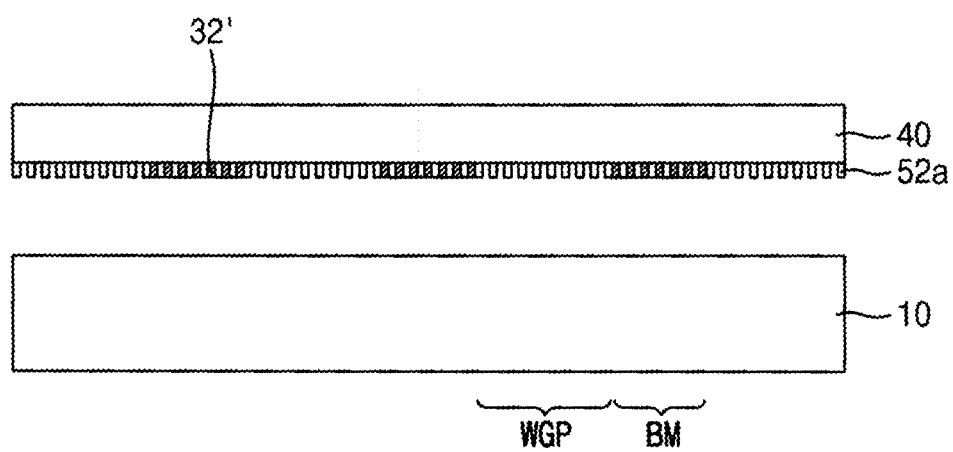

Referring to FIG. 4C, by separating the imprint stamp from the sample, an imprint stamp having a fine pattern 52 formed in the first area WGP and a normal pattern formed in the second area BM by the imprint resist pattern 32' may be formed.

When the imprint stamp is separated from the sample, since the imprint resist pattern layer 32' is semi-cured, the imprint resist pattern 32' may be separated from the sample substrate 10.

Accordingly, the imprint resist pattern 32' is attached between the fine protrusion patterns 50 in the second area BM, so that the fine pattern 52 may not be protruded in the second area BM.

Figure 4D:
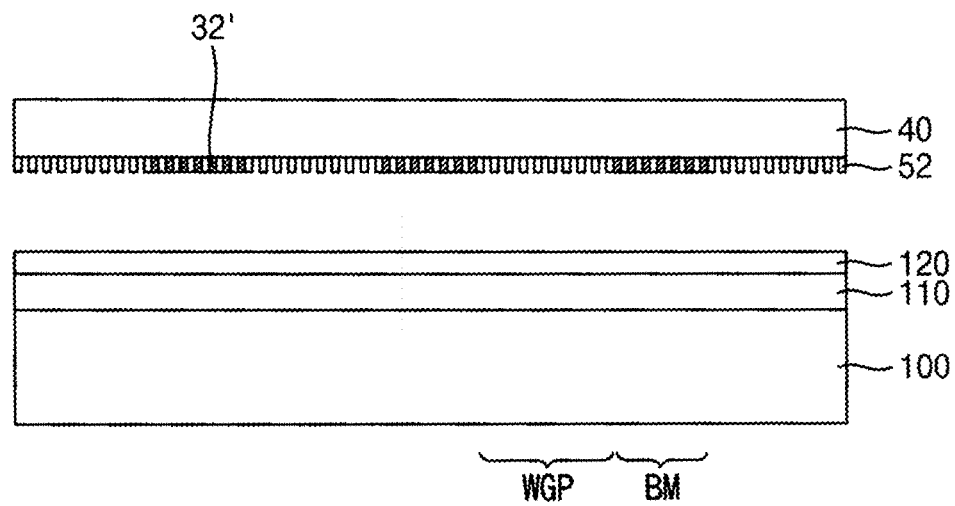

Referring to FIG. 4D, the imprint stamp having the fine pattern 52 only in the first area WGP of the stamp substrate 40 may be provided. A first layer 110 may be formed on a substrate 100. An imprint resist layer 120 may be formed on the first layer 110.

Figure 4E:
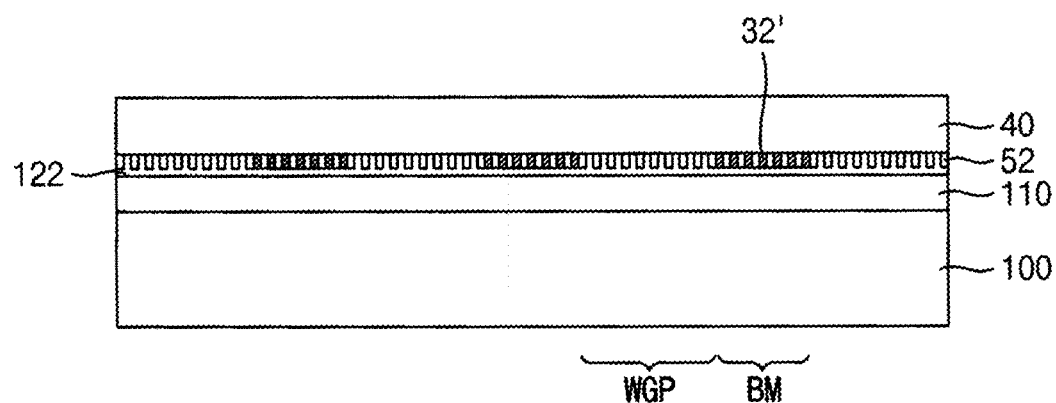

Referring to FIG. 4E, the imprint resist layer 120 may be pressed by the imprint stamp to form an imprint resist pattern 122. Then, the imprint resist pattern 122 may be hardened. For example, when the imprint resist pattern 122 may be cured.

Figure 4F:
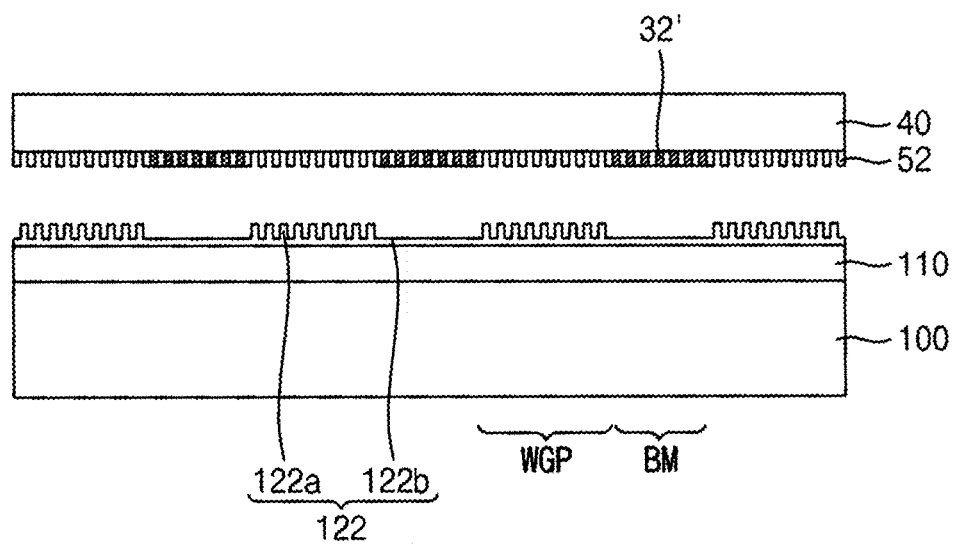

Referring to FIG. 4F, the imprint stamp may be separated from the imprint resist pattern 122. Accordingly, the imprint resist pattern 122 may have a fine pattern 122a formed in the first area WGP and a normal pattern 122b formed in the second area BM. Then, although not illustrated, a residual layer of the fine pattern 122a may be removed.

Figure 4G:
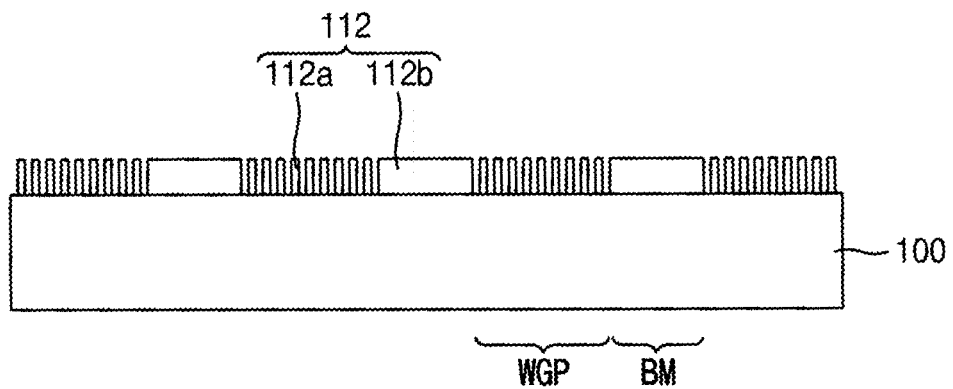

Referring to FIG. 4G, the first layer 110 may be etched using the imprint resist pattern 122 as a mask, so that a first layer pattern 112 may be formed. The first layer pattern 112 may include a fine pattern 112a in the first area WGP and a normal pattern 112b in the second area BM.

FIGS. 5A to 5D are cross-sectional views illustrating the fine pattern and the normal pattern of the display apparatus formed by the imprint stamp of FIGS. 1A to 1G.

Figure 5A:
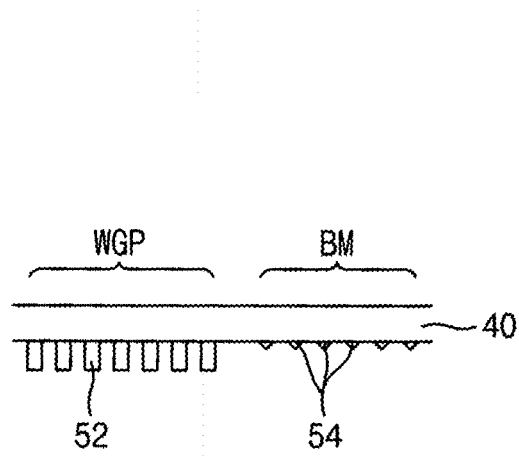
FIG. 5A, FIG. 5B, FIG. 5C, and FIG. 5D are cross-sectional views illustrating the fine pattern and the normal pattern of the display apparatus formed by the imprint stamp of FIGS. 1A to 1G.

Referring to FIG. 5A, a fine pattern 52 is formed on a stamp substrate 40 of an imprint stamp in a first area WGP, and a plurality of track patterns 54 are formed in a second area BM.

The fine pattern 52 may be a wire grid polarizer pattern. The track pattern 54 may be protrusions formed in a direction parallel to an extending direction of each fine line of the wire grid polarizer pattern.

Referring back to FIG. 1C, when the fine pattern 52 is formed by separating the fine protrusion pattern 50 (see FIG. 1A) from the stamp substrate 40 by the imprint resist pattern 32, a portion of the fine protrusion pattern 50 corresponding to the second area BM may be formed on the stamp substrate 40. Thus, when the portion of the fine protrusion pattern 50 corresponding to the second area BM is cut off from the stamp substrate 40, the track pattern 54 may be formed on the stamp substrate 40. The track pattern 54 may be a residue of the portion of fine protrusion pattern 50, so that the track pattern 54 may have a shape of a portion of the wire grid polarizer pattern.

Thus, the track pattern 54 may be protrusions formed in a direction parallel to an extending direction of each fine line of the wire grid polarizer pattern, and a distance between the protrusions may be equal to or integral multiples of the pitch of the wire grid polarizer pattern.

Figure 5B:
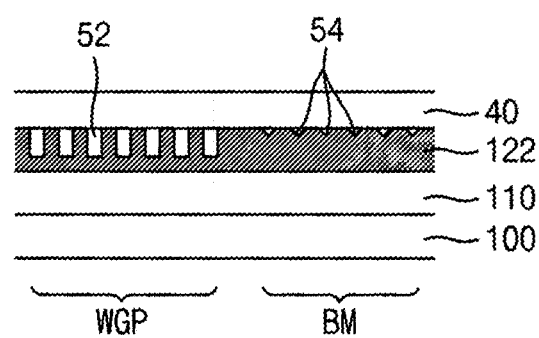
Figure 5C:
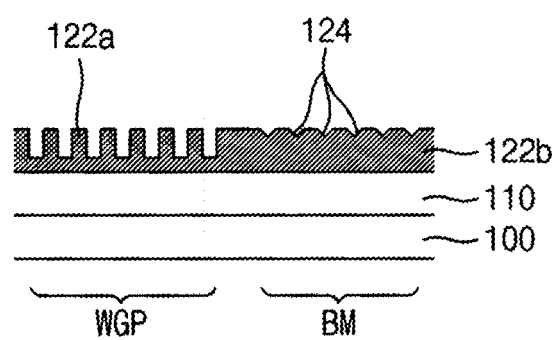

Referring to FIGS. 5B and 5C, when an imprint resist pattern 122 is formed by pressing an imprint resist layer 120 using the imprint stamp, a track 124 may be formed on an upper surface of the imprint resist pattern 122 by the track pattern 54 in the second area BM. Accordingly, the track 124 may be grooves formed in the direction parallel to the extending direction of each fine line of the wire grid polarizer pattern. Thus, a fine pattern 122a may be formed in the first area WGP, and a normal pattern 122b having an upper surface formed with the track 124 may be formed in the second area BM.

Figure 5D:
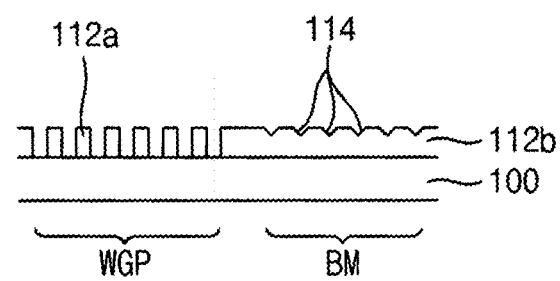

Referring to FIG. 5D, using the imprint resist pattern 122 as a mask, a first layer pattern 112 may be formed by etching the first layer 110. The first layer pattern 112 may include a fine pattern 112a in the first area WGP and a normal pattern 112b in the second area BM.

Here, a track 114 may be formed on an upper surface of the normal pattern 112b by the track 124 of the imprint resist pattern 122. Thus, the track 114 may be grooves formed in the direction parallel to the extending direction of each fine line of the wire grid polarizer pattern. In addition, the distance between the grooves may be equal to or integral multiples of the pitch of the wire grid polarizer pattern.

Figure 6A:
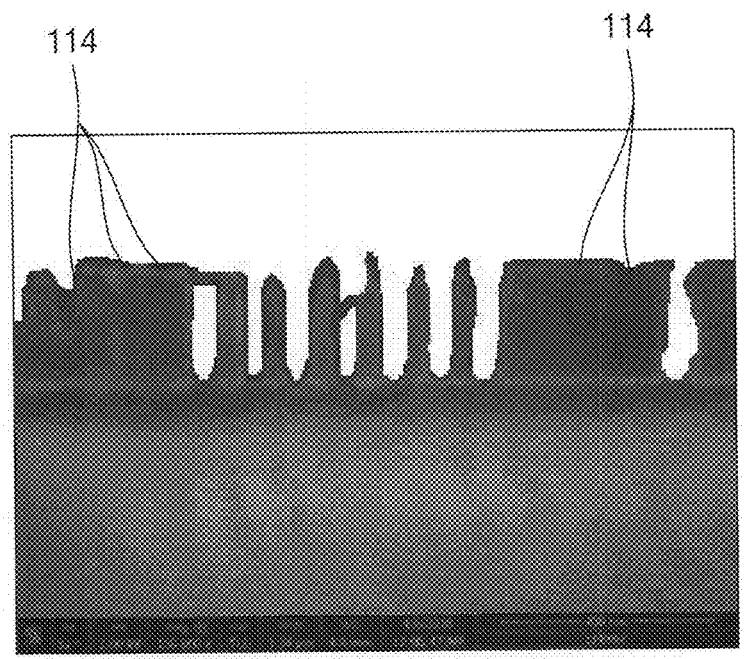
FIG. 6A and FIG. 6B are scanning electron microscopy (SEM) images of the fine pattern and the normal pattern of FIG. 5D.
Figure 6B:
Figure 6B:
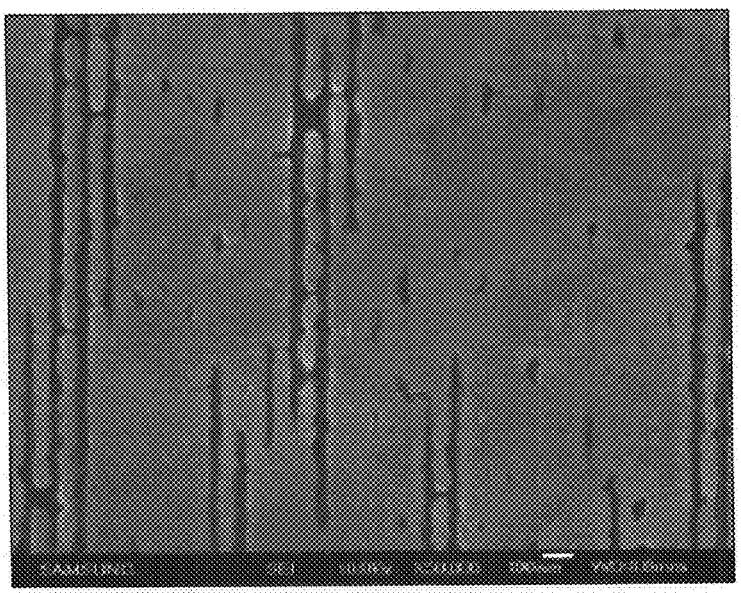

FIGS. 6A and 6B are scanning electron microscopy (SEM) images of the fine pattern and the normal pattern of FIG. 5D.

FIG. 6A is an SEM cross-sectional image of the first layer pattern (see FIG. 5D) in the first area WGP (see FIG. 5D) in which the fine pattern 112a is formed, and in the second area BM (see FIG. 5D) in which the normal pattern 114 is formed.

FIG. 6B is an SEM plan image of the upper surface of the normal pattern in the second area.

According to exemplary embodiments, a fine pattern and a normal pattern may be formed on an imprint stamp by a relatively simple method without an additional photolithography process.

In addition, it may be possible to manufacture an imprint stamp that may simultaneously form a wire grid pattern and a black matrix pattern without any additional design cost by using a display substrate having the black matrix pattern as a sample including a sample pattern.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method of manufacturing an imprint stamp, the method comprising:
    forming an imprint resist only in a second area of a sample substrate, the sample substrate comprising a first area and the second area;
    pressing the imprint resist with a preliminary imprint stamp and curing the imprint resist, the preliminary imprint stamp comprising a fine protrusion pattern that corresponds to the first area and the second area of the sample substrate; and
    separating the preliminary imprint stamp from the sample substrate, such that a portion of the fine protrusion pattern corresponding to the second area is separated from the preliminary imprint stamp by the cured imprint resist.

2. The method of claim 1, wherein the fine protrusion pattern has the same pattern as a wire grid pattern.

3. The method of claim 2, wherein a pitch of the fine protrusion pattern is 50 nm to 150 nm.

4. The method of claim 2, wherein the sample substrate comprises a sample pattern in the second area.

5. The method of claim 4, wherein:
    the sample substrate comprises a display substrate of a display apparatus; and
    the sample pattern comprises a black matrix pattern of the display apparatus.

6. The method of claim 5, wherein a line width of the sample pattern is at least 10 μm.

7. The method of claim 1, wherein the imprint resist comprises at least one of thermosetting resin and photocurable resin.

8. The method of claim 7, wherein the fine protrusion pattern of the imprint stamp is formed by curing the at least one of the thermosetting resin and photocurable resin.

9. The method of claim 8, wherein the imprint resist and the fine protrusion pattern comprise the same material.

10. The method of claim 1, wherein in the step of separating the preliminary imprint stamp from the sample substrate, a process condition is set such that a bonding force between the cured imprint resist and the fine protrusion pattern is:
    greater than a releasing force between the cured imprint resist and the fine protrusion pattern; and
    greater than strength of a structure of the fine protrusion pattern.

11. The method of claim 1, wherein the imprint resist is formed only in the second area using an inkjet method.

12. The method of claim 11, wherein the imprint resist contacts the sample substrate.

13. The method of claim 11, wherein:
    a sample pattern is formed in the second area of the sample substrate; and
    the imprint resist is disposed on the sample pattern.

* * * * *